US010452795B2

(12) United States Patent
Roberts et al.

(10) Patent No.: US 10,452,795 B2
(45) Date of Patent: Oct. 22, 2019

(54) MODELLING BEHAVIOUR OF MATERIALS DURING CRUSH FAILURE

(71) Applicant: ENGENUITY LIMITED, Cuckfield Sussex (GB)

(72) Inventors: Richard Roberts, Westerham (GB); Graham Barnes, Dormansland (GB); Ian Coles, Bolney (GB)

(73) Assignee: Engenuity Limited, Cuckfield, Sussex (GB)

( * ) Notice: Subject to any disclaimer, the term of this patent is extended or adjusted under 35 U.S.C. 154(b) by 239 days.

(21) Appl. No.: 14/917,862

(22) PCT Filed: Sep. 5, 2014

(86) PCT No.: PCT/GB2014/052706
§ 371 (c)(1),
(2) Date: Mar. 9, 2016

(87) PCT Pub. No.: WO2015/036739
PCT Pub. Date: Mar. 19, 2015

(65) Prior Publication Data
US 2016/0224706 A1    Aug. 4, 2016

(30) Foreign Application Priority Data
Sep. 11, 2013 (GB) .................................. 1316156.7

(51) Int. Cl.
*G06F 17/50* (2006.01)

(52) U.S. Cl.
CPC ...... *G06F 17/5018* (2013.01); *G06F 17/5095* (2013.01)

(58) Field of Classification Search
CPC ............. G06F 17/5018; G06F 17/5095; B60R 2019/1866
(Continued)

(56) References Cited

U.S. PATENT DOCUMENTS 3,914,993 A * 10/1975 Babcock ............... G01L 1/2218
                                                               73/767
6,962,245 B2 * 11/2005 Ray ..................... E01F 15/146
                                                              188/372
(Continued)

FOREIGN PATENT DOCUMENTS

CN    101390027 A    3/2009
CN    102666197 A    9/2012
(Continued)

OTHER PUBLICATIONS

International Search Report dated Dec. 3, 2014 from International Patent Application No. PCT/GB2014/052706, 6 pages.
(Continued)

*Primary Examiner* — Thai Q Phan
(74) *Attorney, Agent, or Firm* — Ohlandt, Greeley, Ruggiero & Perle, L.L.P.

(57) ABSTRACT

A method of calculating an impact resistance of a structure undergoing an impact with an impact surface is disclosed. The structure includes a first part bonded or secured to a second part, at least the first part comprising a material having a crush failure mode. The method comprises:
  a) determining that a finite element representing a portion of the first part is experiencing conditions which dictate that it will undergo the crush failure mode;
  b) determining a behaviour of the structure assuming it is subject to:
    i) an ongoing resistance force representing the crush failure mode of the element; and
    ii) a further force F acting on the first and second parts in a direction tending to separate them.

18 Claims, 8 Drawing Sheets

(58) Field of Classification Search
USPC .............. 703/2, 6; 73/767, 821; 188/371
See application file for complete search history.

(56) References Cited

U.S. PATENT DOCUMENTS

| | | | |
|---|---|---|---|
| 8,573,372 B2* | 11/2013 | Humfeldt | B60R 22/28 188/371 |
| 8,662,265 B2* | 3/2014 | Humfeldt | F16F 7/123 188/371 |
| 9,254,769 B2 | 2/2016 | Gross et al. | |
| 2006/0004550 A1* | 1/2006 | Coles | G06F 17/5018 703/1 |
| 2012/0186369 A1* | 7/2012 | Matlschweiger | G01M 7/08 73/865.3 |
| 2016/0085892 A1* | 3/2016 | Coles | G06F 17/5018 703/8 |

FOREIGN PATENT DOCUMENTS

| | | |
|---|---|---|
| JP | 2002-296163 A | 10/2002 |
| JP | 2007-528970 A | 10/2007 |
| JP | 2008-505416 A | 2/2008 |
| WO | 2005/116478 A2 | 12/2005 |
| WO | 2006/003438 A2 | 1/2006 |
| WO | 2007/096322 A2 | 8/2007 |

OTHER PUBLICATIONS

Written Opinion dated Dec. 3, 2014 from International Patent Application No. PCT/GB2014/052706, 8 pages.
Barnes et al.; Crash Safety Assurance Strategies for Future Plastic and Composite Intensive Vehicles (PCIVs)'; Jun. 1, 2010, pp. 1-140, XP055154399, Retrieved from the Internet: URL:http://www.nhtsa.gov/DOT/NHTSA/NVS/Crashworthiness/Plastics/DOT-VNTSC-NHTSA-10-01.pdf.
David et al.; "Effect of strain rate on the failure mechanisms and energy absorption in polymer composite elements under axial loading"; Composite Structures, Nov. 9, 2012, XP055154409, ISSN: 0263-8223, DOI:10.1016/j.compstruct.2014.11.010 abstract.
Han et al.; "A numerical study on the axial crushing response of hybrid pultruded and +/− 45<o> braided tubes"; Composite Structures 80, No. 2, Mar. 12, 2007, pp. 253-264.
Logan et al., "Crashworthiness Analysis Using Advanced Material Models in DYNA3D".
McGregor et al.; "Simulation of progressive damage development in braided composite tubes under axial compression", Composites Part A: Applied Science and Manufacturing, Elsevier Science Publishers B.V., Amsterdam, NL, vol. 38, No. 11, Nov. 1, 2007, pp. 2247-2259.
International Preliminary Report on Patentability dated Mar. 15, 2016 from corresponding International Application No. PCT/GB2014/052706, 8 pages.
Chinese First Office Action dated Jul. 26, 2018 from corresponding Chinese Patent Application No. 201480049721.X, 12 pages.
Japanese Notice of Reasons for Rejection dated Jul. 10, 2018 from corresponding Japanese Patent Application No. 2016-542360, 5 pages.
Yoshimura, Akinori; "Fracture Simulation of Adhesively-bonded Joint in Composite Structure", Journal of the Adhesion Society of Japan, May 1, 2014, vol. 50 No. 5, pp. 179-184.
European Office Action dated Aug. 6, 2018 from corresponding European Patent Application No. 14 772 412.4, 7 pages.
Di Paolo et al.; A study on an axial crush configuration response of thin-wall, steel box components: The quasi-static experiments, 24 pages.

* cited by examiner

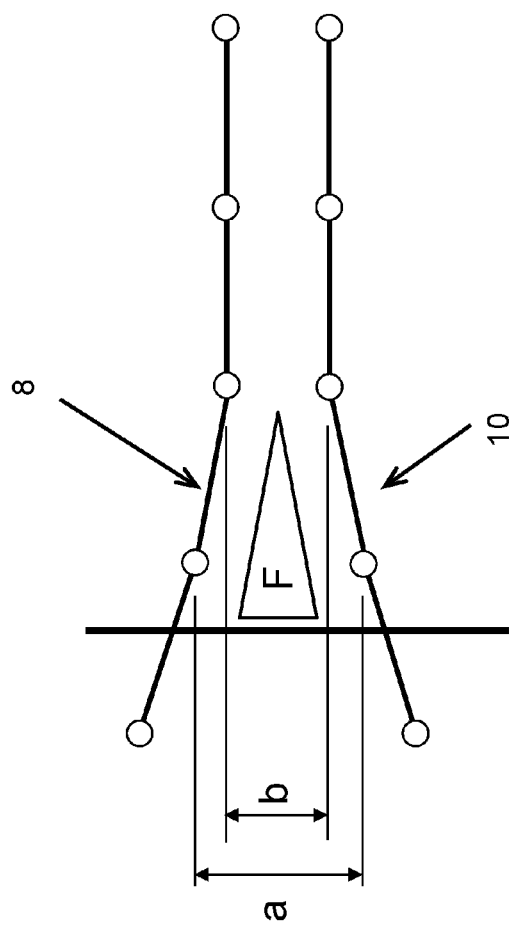
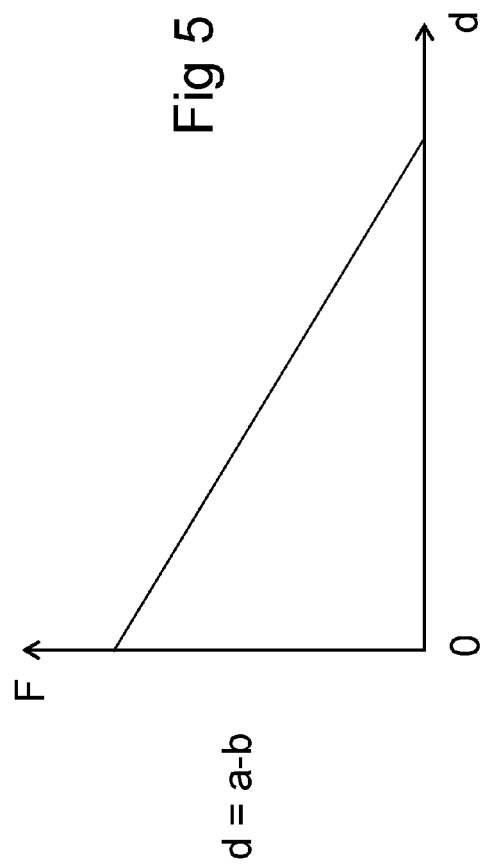
Fig 4
Fig 5

MODELLING BEHAVIOUR OF MATERIALS DURING CRUSH FAILURE

BACKGROUND

1. Field of the Disclosure

This disclosure relates to methods, apparatus and software for modelling the behaviour of materials which are crushed particularly, but not exclusively, in the context of composite vehicle body parts under impact.

2. Discussion of the Background Art

Fibre-reinforced composite materials, particularly carbon fibre composites are becoming an increasingly important part of the designs of new cars and other vehicles. Composites are very light compared to their metal equivalents, even aluminium, and can be formed into complex shapes that can do the same job as many welded metal stampings. Composites also have the ability to absorb high amounts of energy during impacts which make them ideal for automotive, aerospace, rail or civil applications. For example, whereas steel can only absorb up to 20 kilojoules per kilogramme and aluminium approximately 30 kilojoules per kilogramme, carbon composites can absorb up to 80 kilojoules per kilogramme.

Part of the reason that composites have such good energy absorption characteristics is that in addition to the traditional failure modes, such as bending and cracking, through which metals can fail, composites exhibit a completely separate failure mode not present in metals. This is known in the art as the crush failure mode. In this mode the crushed material has essentially no residual strength after it has absorbed the energy. Instead, the composite material is transformed into very small pieces of debris and loosely connected fibres after it has been crushed. This also means that less space is required than in an equivalent metal structure. This is because in a metal structure space must be provided in designated crumple zones to accommodate the buckled metal.

On the microscopic scale such materials absorb energy by local disintegration of the material, by matrix cracking, fibre buckling and fracture, frictional heating etc. Viewed on a macro scale, the material is essentially crushed or consumed by the impact on a continuous basis, and the originally consolidated material is turned into a non-structural debris.

The Applicant's earlier publication WO 2006/003438 describes a revolutionary technique for allowing materials which exhibit a crush failure mode as outlined above to be modelled accurately. This technique, known as CZone™ is now being widely used to design new parts for automobiles and other vehicles.

Prior to CZone, existing finite element analysis techniques could only deal with elements of composite material by existing failure modes and so treated the whole element or the individual layers together making up a laminate, as maintaining their integrity until the 'classic' failure stress value is reached, whereafter the element or each layer at a time is simply deleted from the analysis. This approach gives inaccurate results as it does not reflect how these materials behave in practice. The material does not suddenly disappear but is gradually 'consumed' as it turns to fine debris at the impacting surface. This approach also leads to another problem that arises from the very large forces generated in the model (which do not in fact arise in the actual material being modelled) from failing elements using the classical failure stress. These forces are propagated through the model and can cause unexpected (and unrealistic) failures in the back-up structure.

Despite the usefulness of the CZone technique, the Applicant has now identified that there are some situations where the basic technique is not as accurate and has devised a revised technique which aims to address this.

SUMMARY

When viewed from a first aspect the present disclosure provides a method of calculating an impact resistance of a structure undergoing an impact with an impact surface, the structure including a first part bonded or secured to a second part, at least the first part comprising a material having a crush failure mode, the method comprising:
a) determining that a finite element representing a portion of the first part is experiencing conditions which dictate that it will undergo said crush failure mode;
b) determining a behaviour of said structure assuming it is subject to:
 i) an ongoing resistance force representing said crush failure mode of said element; and
 ii) a further force acting on said first and second parts in a direction tending to separate them.

The disclosure extends to data processing apparatus programmed to: calculate an impact resistance of a structure undergoing an impact with an impact surface, the structure including a first part bonded or secured to a second part, at least the first part comprising a material having a crush failure mode, by:
a) determining that a finite element representing a portion of the first part is experiencing conditions which dictate that it will undergo said crush failure mode;
b) determining a behaviour of said structure assuming it is subject to:
 i) an ongoing resistance force representing said crush failure mode of said element; and
 ii) a further force acting on said first and second parts in a direction tending to separate them.

The disclosure also extends to a computer program containing instructions to: calculate an impact resistance of a structure undergoing an impact with an impact surface, the structure including a first part bonded or secured to a second part, at least the first part comprising a material having a crush failure mode, by:
a) determining that a finite element representing a portion of the first part is experiencing conditions which dictate that it will undergo said crush failure mode;
b) determining a behaviour of said structure assuming it is subject to:
 i) an ongoing resistance force representing said crush failure mode of said element; and
 ii) a further force acting on said first and second parts in a direction tending to separate them.

The disclosure further extends to a non-transitory computer readable medium bearing said computer program.

Thus it will be seen by those skilled in the art that in accordance with the disclosure, at least in its preferred embodiments, where a structure comprises two parts bonded or secured together, as well as modelling the crush failure with an ongoing resistance force, a further force is provided for, which tends to separate the two parts. The further force represents the tendency observed by the Applicant for bonded parts undergoing crush failure mode to be forced apart by the debris created by the crushing which is not fully compressible. This represents a refinement of the basic CZone technique which does not model this force. It also represents a realisation that although in general the fine debris created during crushing can be disregarded since it retains no structural integrity, where the debris is confined in a small space as in the situation described above, it does become significant.

The ongoing resistance force representing the crush failure mode and/or the further force acting to separate the first and second parts could be determined using materials theory. The necessary calculations could be carried out dynamically as part of the method disclosed herein, or could be carried out in advance and the results thereof employed in the method disclosed herein. However in a set of embodiments, the two forces outlined above are each approximated to respective single macroscopic values for a given set of macroscopic conditions (area of contact with impactor, velocity, angle of impact etc.). The respective values may therefore be obtained empirically by performing tests on small samples (known in the art as "coupons") of the material in question which thereafter allows it to be modelled in large, complex structures. The benefit of this approach is that it is not necessary to calculate or even understand the internal mechanisms at work during crush, which are often highly complex. For example in fibre composite materials they depend on, inter alia, fibre type and sizing, the resin properties, the cure cycle and the weave style.

In a set of embodiments the further force is a function of the separation between the first and second parts. Over at least a given range of separation the further force may be inversely dependent on the separation—that is the force decreases as the separation increases. The function could be defined by a mathematical relationship (e.g. linear) or could determined empirically. Where the function is defined by a mathematical relationship the parameters thereof may nonetheless be determined empirically. However this too is not essential, the parameters could be determined analytically.

The further force could be a function of just the separation between the first and second parts or could also be dependent on other variables such as the thickness of the parts, velocity of the first and/or second parts, temperature, angle of impact etc.

In a set of embodiments the further force is applied as part of a cohesive element formulation which encapsulates cohesive strength modelling and said further force. However this is not essential.

The further force could be calculated as part of calculations to determine the behaviour of a bond between the first and second parts—i.e. part of a 'bond model' but this is not essential.

The first and second parts could, for example, be bonded together by an adhesive, secured together mechanically such as by bolt, screw, rivet etc. or could simply be held together by other parts of the structure or a super-structure.

As mentioned above in accordance with the disclosure the ongoing resistance force represents the crush failure mode. This will typically be applied while the impact surface moves across a space allocated to said element and resistive forces are applied corresponding to the crush performance of the material or laminate assigned to the said element. This emphasises the distinction over traditional finite element modelling which treated the impact surface as effectively impenetrable and so had to delete an element after its failure stress had been reached, whereas in accordance with the disclosure the element still has an effect on the impact surface after the impact surface has encroached into the space occupied by the element One way to visualise this conceptually is the element remaining but giving rise to a resistance as it 'passes through' the barrier. Such a situation is not possible in conventional finite element models.

The impact surface may correspond exactly to the actual physical surface causing the impact or it may comprise a crush front having a fixed relationship to the actual location of the barrier.

In a set of embodiments the element is subjected to axial crush failure—that is the component of force applied to the element perpendicular to its shortest, or thickness, axis is great enough to initiate crush failure.

In accordance with the disclosure elements comprising the respective entire material thicknesses of the first and second parts could be modelled together or, where the one or both of the materials comprise laminated layers, each layer or sub-group of layers could be modelled separately.

The disclosure could be applied where only one of the first and second parts is susceptible to crush but more typically the first and second parts are susceptible to crush.

The impact surface could correspond to a rigid solid object striking the structure, but this is not essential. The impact surface could comprise another part or body of the structure with sufficient strength and rigidity.

In some embodiments it may be preferred, e.g. for reasons of computational efficiency, that the relative velocity of the impact surface and the first and second parts is taken to be constant during consumption of a given element. However, this is not essential and in a set of embodiments the relative velocity is adjusted during the passage of the impact surface through the space allocated to the element. The resistive force may be modified along the length of the element in accordance with a predetermined function of the relative velocity.

Similar considerations apply to angle dependence to allow for rotation during consumption of the element. Indeed in general any parameter on which the crush resistance depends may be updated during consumption of the element, another example being the thickness, vibration, temperature etc.

In some preferred embodiments the friction of the crush interface with the impact surface—e.g. barrier or other crush front—may be specified. This is advantageous as it can influence whether a given element is stable enough to undergo crush or whether it fails by another mechanism.

Modelling of the effect of an impact of a structure including crushable materials in accordance with the disclosure may be carried out without taking damping into account. In some embodiments however damping coefficients are specified which could be internal, external or specified globally by the overall finite element analysis model.

The disclosure may be applied to any materials which can be crushed, i.e. those which disintegrate with little or no residual strength under certain conditions. Some possible and non-limiting examples include concrete, wood, glasses, ceramics, honeycombs and foams. In preferred embodiments of the disclosure the crushable material comprises a composite material, more preferably a fibre-reinforced composite material and most preferably a carbon-fibre reinforced resin.

Although the principles of the disclosure may be widely applied, e.g. as part of an original analysis model, preferably software implementing the disclosure is incorporated into an existing finite element modelling package. The type of finite element modelling is preferably non-linear and could be implicit, explicit or another type of analysis mathematics, although explicit non-linear analysis is preferred. In the currently preferred embodiment for example, the software is incorporated into Simulia's ABAQUS (trade mark) explicit non-linear finite element analysis software.

Embodiments of the present disclosure will now be described, by way of example only, with reference to the accompanying drawings in which:

BRIEF DESCRIPTION OF THE DRAWINGS

FIG. 4 is a diagram similar to FIG. 3 illustrating flange separation;

FIG. 5 is an exemplary graph of the change flange separation vs burst force;

DETAILED DESCRIPTION OF THE PREFERRED EMBODIMENT

Figure 1:
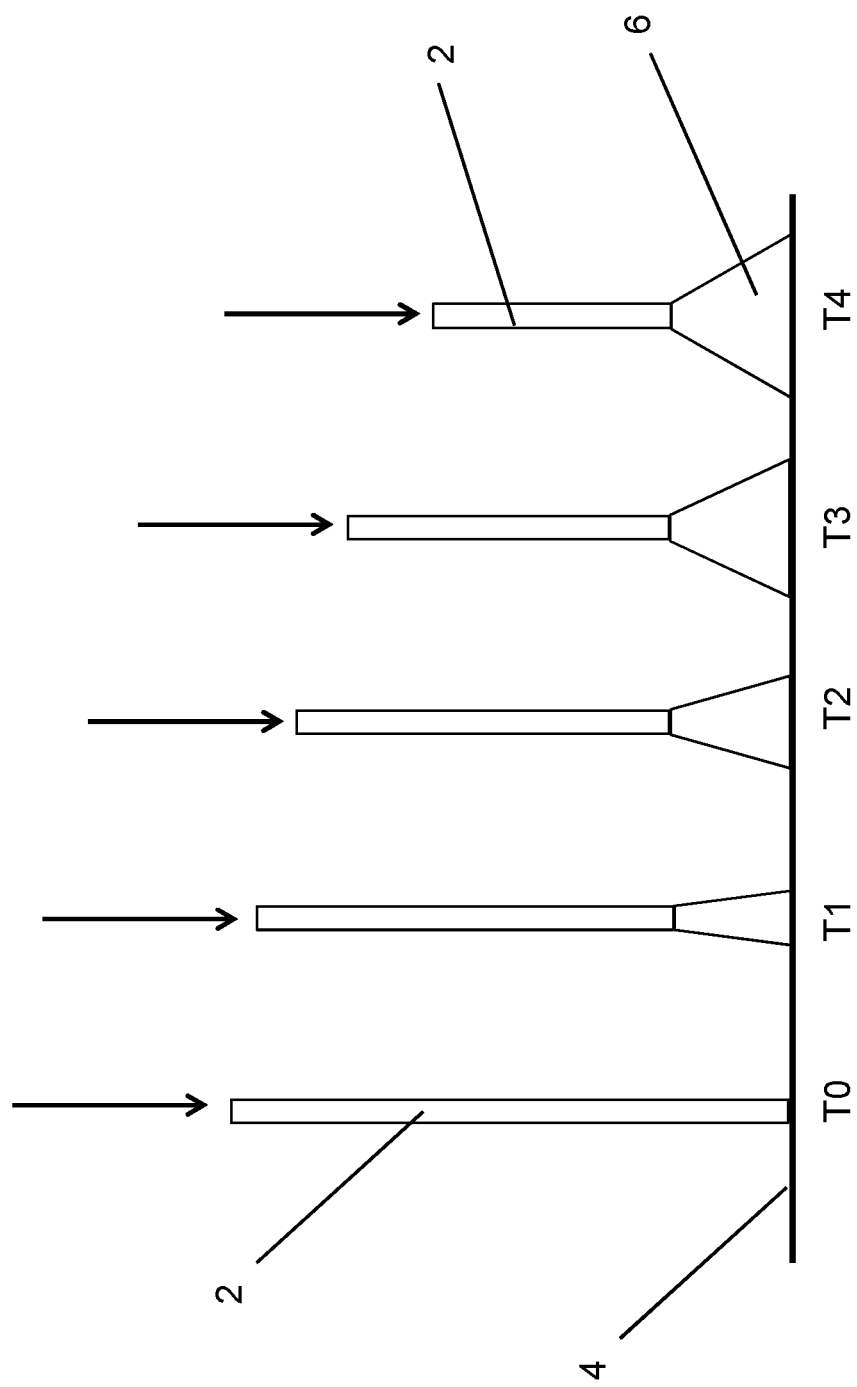
FIG. 1 is a schematic illustration of the generation of debris by a sheet of composite material being crushed against a barrier.

Turning first to FIG. 1 this shows the progression of a laminar sheet 2, e.g. of carbon-fibre reinforced composite material, undergoing an axial impact with a barrier 4 which constitutes an impact surface and thereby suffering failure through a crush failure mode. This is the process which is modelled by the methods described in WO 2006/003438 and by the Applicant's CZone software.

As is illustrated schematically, as the impact progresses from t0 through to time t4, the sheet 2 is gradually consumed as it is turned into fine debris 6. The debris 6 does not retain any residual ability to absorb energy and in general will fall away without playing any further part in the process. The debris 6 is not modelled in CZone.

Figure 2:
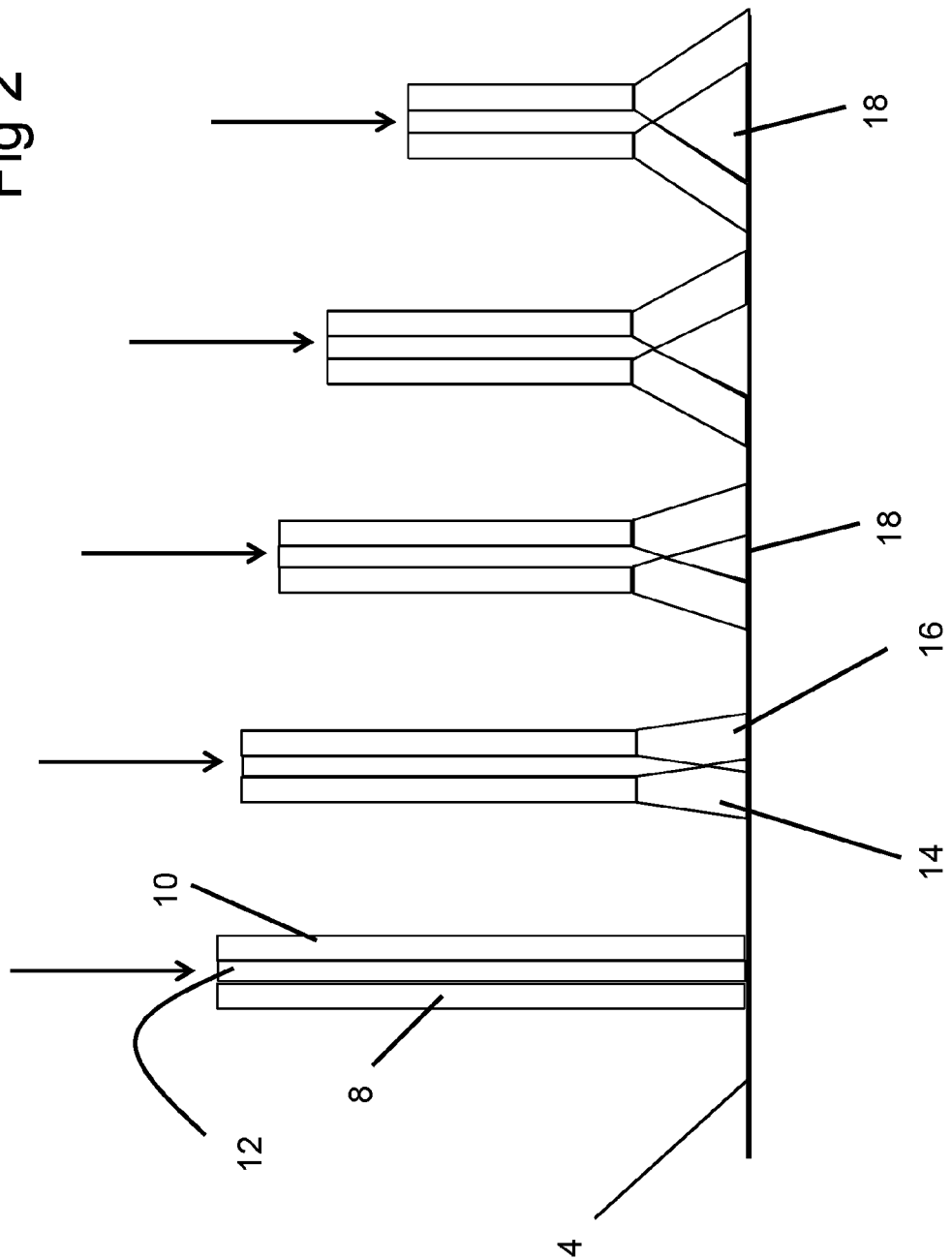
FIG. 2 is an illustration similar to FIG. 1 but showing two sheets bonded together.

However with reference to FIG. 2 it may be seen that the situation is more complicated when two sheets of crushable material 8, 10 comprise a pair of flanges bonded together—e.g. by an adhesive layer 12. Each flange 8, 10 produces a quantity of debris 14, 16. As may be observed in FIG. 2 the two quantities of debris 14, 16 tend to overlap in an area 18. Although the debris 14, 16 does not contribute to the impact resistance of the structure, in this situation it cannot be ignored completely as it is not fully compressible. What the Applicant has observed in reality is that as the potentially overlapping debris 18 is generated it generates a reaction force which tends to force the two flanges 8, 10 apart so that the respective debris 14, 16 is no longer trying to occupy the same space. This is illustrated in the diagram in FIG. 3.

Figure 3:
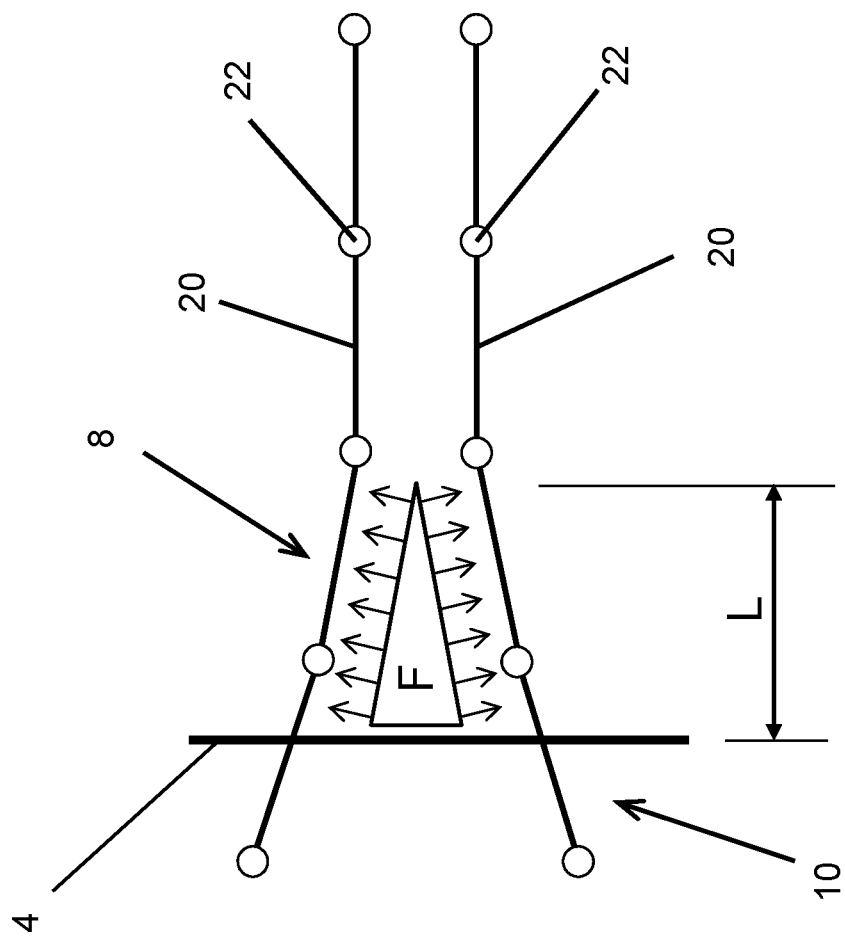
FIG. 3 is a diagram illustrating the application of the novel crush burst force.

FIG. 3 shows diagrammatically the burst force F which is acting to drive the two flanges 8, 10 apart through a force exerted substantially normally to the crushing elements from the triangular pressure distribution and represented by the small arrows. It will be appreciated that the triangular pressure distribution is merely an example and other distributions are possible, The bonded flanges 8, 10 are represented by individual discrete elements 20 connected at nodes 22 as in a finite element model. The burst force F is shown as extending over a distance L back from the barrier 4.

As may be seen from FIGS. 4 and 5, the force F is modelled as being inversely proportional to a parameter d which represents the increase in separation of the two flanges 8, 10 from their initial configuration. Thus d=a−b where a is the actual separation between corresponding nodes of the two sheets 8, 10 and b is the original separation in their bonded configuration. It can be seen therefore that the burst force decreases as the two flanges 8, 10 move apart.

Figure 6:
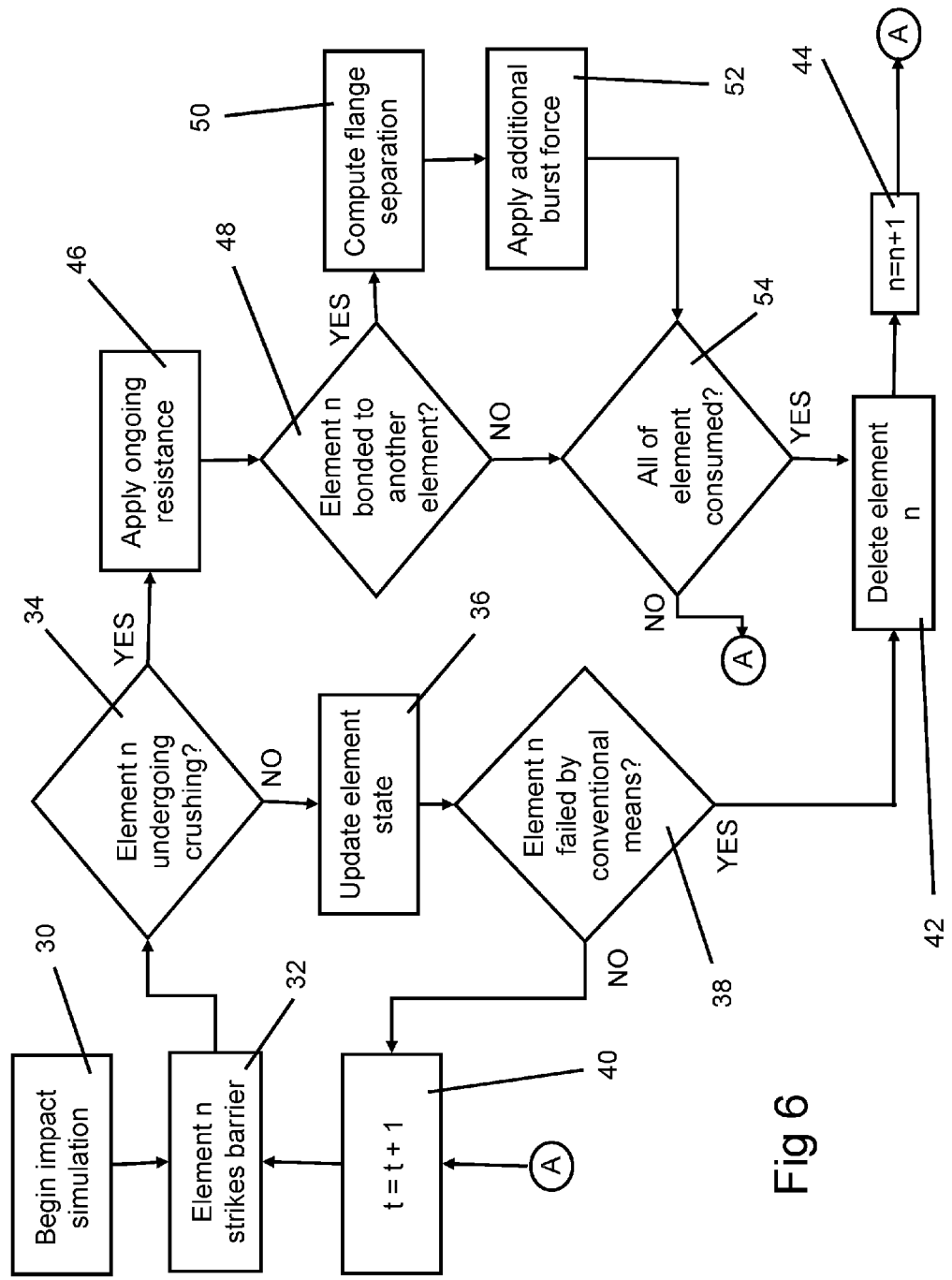
FIG. 6 is a flow chart illustrating operation of a method in accordance with the disclosure.

FIG. 6 is a flow chart illustrating operation of an embodiment of the disclosure whereby a row of composite elements impacting a barrier are modelled. This comprises a process to simulate the behaviour of a structure made of composite material which is subject to an impact with a solid, impenetrable barrier. The simulation is carried out using a modified version of an explicit finite element analysis package. Although the principles of the disclosure may be widely applied, e.g. as part of an original analysis model, preferably software implementing the disclosure is incorporated into an existing finite element modelling package. The type of finite element modelling is preferably non-linear and could be implicit, explicit or another type of analysis mathematics, although explicit non-linear analysis is preferred. In the currently preferred embodiment for example, the software is incorporated into ABAQUS Explicit (trade mark) explicit non-linear finite element analysis software.

The finite element package is configured with all the relevant material properties such as Young's modulus, failure stress, crush stress, thickness, layup etc.; environmental properties such as temperature and humidity; and dynamic properties such as the initial closing velocity of the barrier and the structure. The structure may be a complete object such as a car, a component such as a bumper, a low speed energy absorber, or chassis rail, or indeed any arbitrary section of an object or component or collection of components.

At step 30 the portion of the simulation being described here begins and is illustrated as taking place with an element n striking the barrier (step 32). For each time step, t the simulation is carried out for all of the elements in the structure. At step 34 it is determined whether element n is crushing (undergoing the crush failure mode). This decision is based primarily on the material from which the element is made (i.e. is it a crushable material) and the dynamic conditions which the element is experiencing for example the stress which is applied to the element (i.e. is this in excess of the element's crush initiation stress) or the out-of-plane presentation angle.

If the element n is not undergoing crushing then the analysis proceeds conventionally by updating the element state (step 36), determining whether the element has failed through a conventional mode (step 38) and then either proceeding to the next time iteration (step 40) or deleting the element (step 42) and moving onto the next element (step 44). The skilled person will appreciate that the description given here is extremely simplified in comparison to all the steps carried out in practice but the details thereof are well known per se to those skilled in the art and not important to an understanding of the present disclosure.

As is described in greater detail in WO 2006/003438, if the element n is determined to be undergoing crushing at step 34, an ongoing resistance is applied at step 46. The resistance value for the element may be dependent on a number of intrinsic and extrinsic factors. The resistance may be applied to some or all nodes of the element or to other nodes.

In accordance with the present disclosure a determination is made at step 48 as to whether the element n is bonded to another element. Clearly this determination could be made at another stage in the process. If the element n is bonded to another element a computation is carried out at step 50 to determine the separation of the flange of which the element n forms a part from the bonded flange. The separation that is determined is used to calculate and apply, if appropriate, an additional burst force using a relationship like that shown in FIG. 5 (step 52).

At step 54 it is determined whether element n has been completely consumed by the crush failure—i.e. whether it has all been converted to fine debris. If not analysis continues to the next time step (at step 40) whereas if the element has been completely consumed, the barrier makes contact with the next element (step 44).

Thus it will be seen from the embodiment described above that the additional burst force represents an enhancement to the previous crush modelling technique used by the Applicant's CZone software. This allows more accurate modelling of structures in which two flanges are bonded or otherwise secured together.

Figure 7:
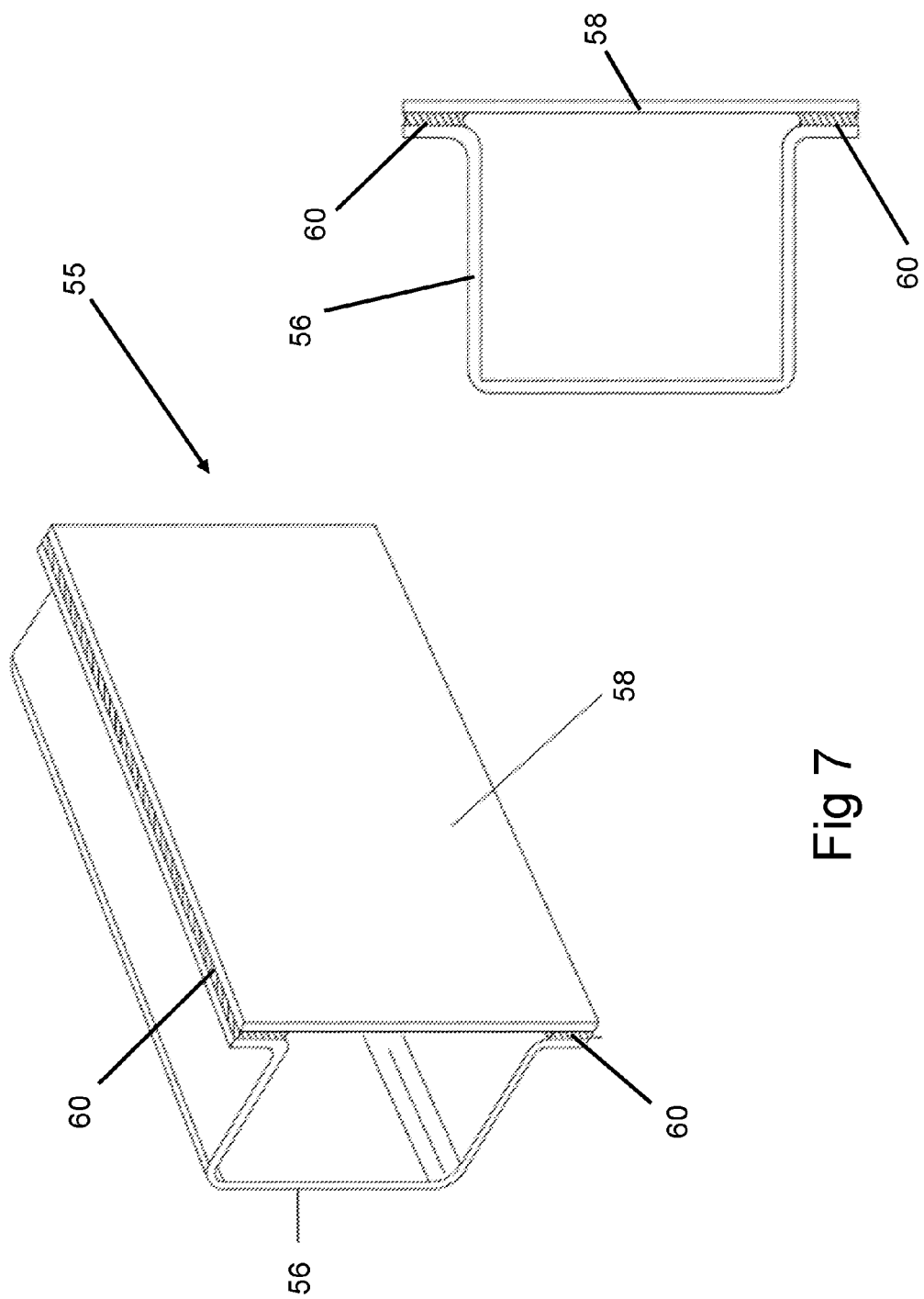
FIG. 7 is an exemplary load-bearing structure to which the disclosure may be applied.
Figure 8:
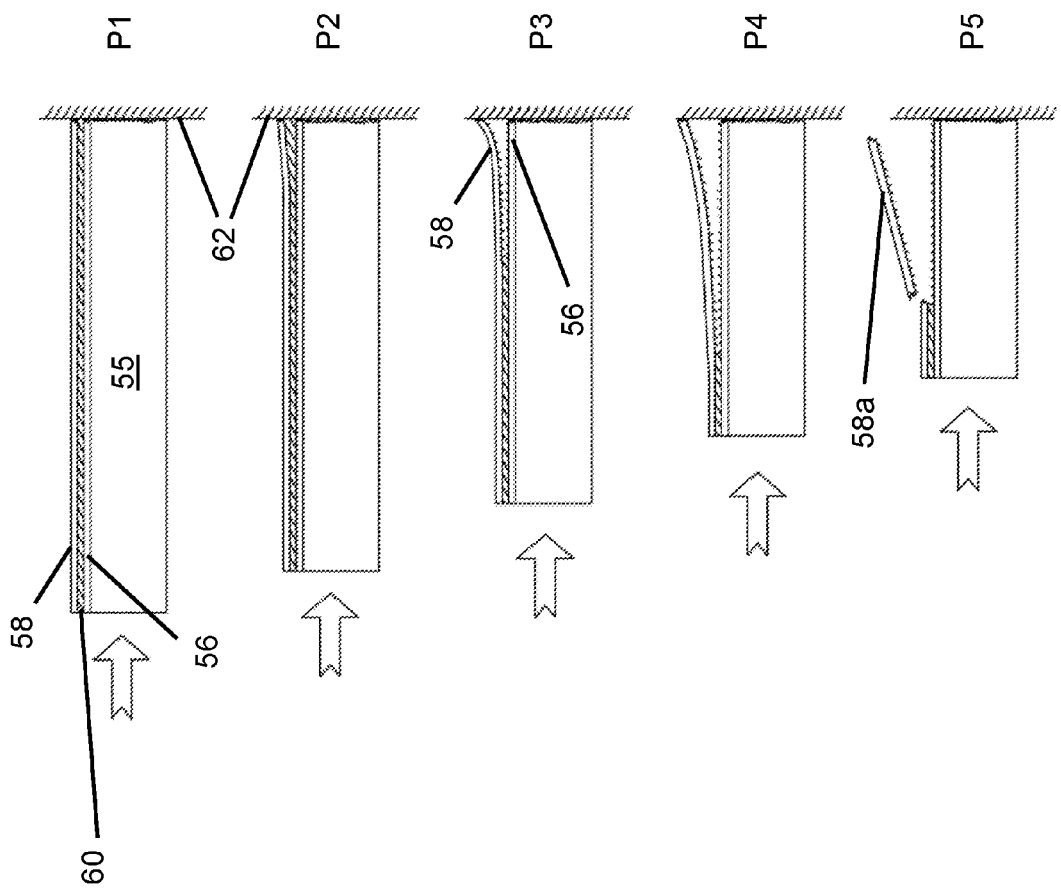
FIG. 8 is a series of illustrations of the progress of the structure of FIG. 7 being crushed against a barrier.
Figure 9:
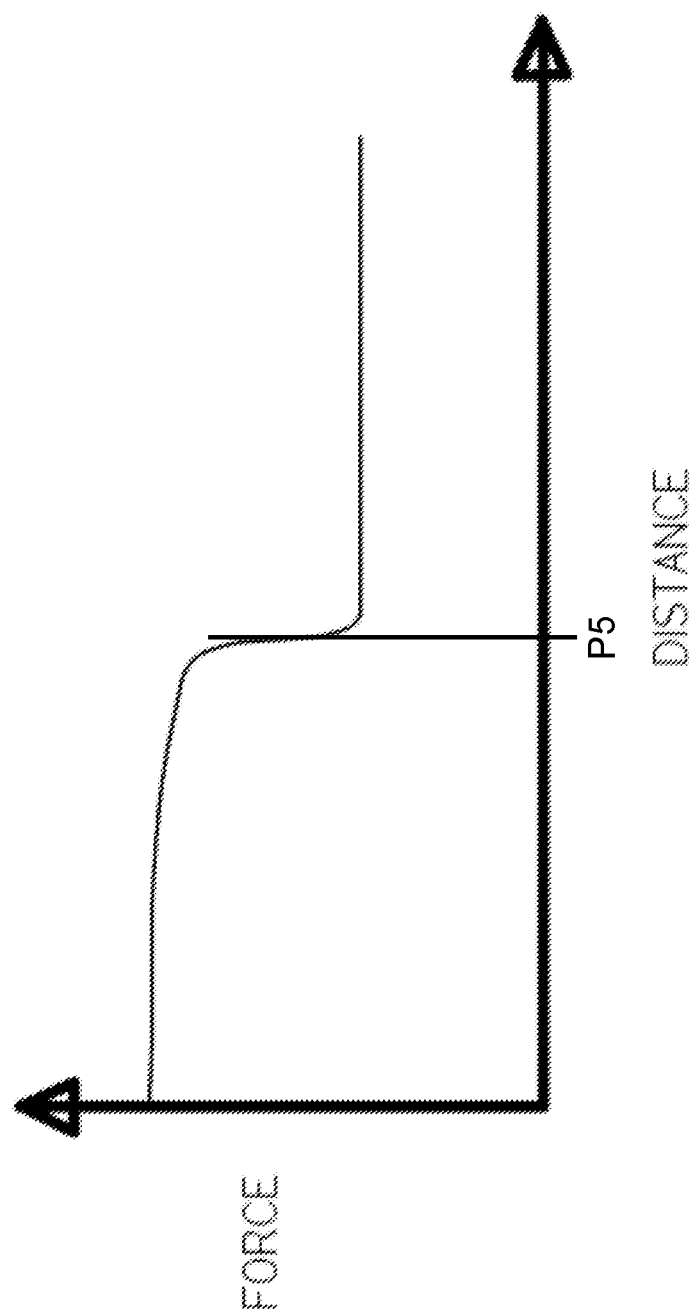
FIG. 9 is a graph showing resistance force against time during the crush.

As a further illustration of the improvement which may be achieved in accordance with embodiments of the disclosure, further reference is made to FIGS. 7 to 9.

FIG. 7 shows in perspective and cross-section views an example of a two part crushable structure 55 bonded along axial flanges using an adhesive. This is a typical architecture deployed for energy management in crash in the front and rear structures of an automobile body shell. The first part 56 is a carbon fibre-reinforced plastic 'top hat' moulding and the second part 58 is a carbon fibre-reinforced plastic flat 'closer' panel. The two parts are bonded together by an adhesive layer 60.

Simulation is carried out of the crushable structure 55 being impacted against a rigid wall 62 as is shown in FIG. 8. As discussed previously, adhesive bonded sections are susceptible to flange and adhesive failure if they are situated in the crush region. A typical requirement for occupant safety is for the closed section to retain its integrity to absorb energy as the crush progresses from the front to the rear of the structure 55. As will be demonstrated, the embodiment of the disclosure can predict local failures in the adhesive joint 60 caused by the debris arising from the crushable parts 56, 58 undergoing crush. This allows these parts to be designed and a suitable adhesive selected such that premature catastrophic collapse can be prevented and a deficiency avoided in the amount of energy actually absorbed compared to specification.

In some designs, as shown in FIG. 8 for example where the structure 55 is crushed against a barrier 62, the strength of the bonding flange is not sufficient to resist the forces tending to separate the flanges through the interference of the crushed debris from the top hat 56 and the closer panel 58 of the crushable structure 55. It is due to the action of the "splaying" forces generated from the crushed debris that a failure in the bonded joint 60 is initiated at the crushing end of the section. This area of bond failure then grows along the adhesive flange towards the rear of the section and eventually a loss of structural integrity occurs and a portion 58a of the flat composite part 58 beaks away and does not participate further in the energy absorption process. Although not shown in FIG. 8, the hat section 56 may also lose the inherent stability afforded by a closed box section structure.

In more detail, at point P1 the structure 55 has contacted the barrier 62 and crushing has been initiated in the ends of the crushable carbon fibre composite parts 56, 58. Both components 56 and 58 are still connected and the adhesive 60 is intact close to the barrier 62. The impact progresses in the direction of the arrow.

At P2 some distance after P1, crush has continued and the debris being created is interfering with the adhesive 60 local to the impact face which causes splaying of the less stiff closer panel 48 away from the top hat flange 56. The adhesive bond 60 is being strained perpendicularly to the direction of crush.

At P3 some distance after P2 a failure has been initiated in the adhesive joint 60 just behind the crushing interface. This is depicted in the illustration as a cohesive failure (depending on the detailed characterisation of the adhesive in use this could have occurred at either of the bonding interfaces as well or instead). This has the effect of allowing the composite closer plate part 58 to push further away from the stiffer hat section part 56. Both parts at this point in the sequence are still crushing against the barrier 62.

At P4 some distance after P3 the crack in the adhesive 60 has grown further towards the rear of the structure. The flat closer plate 58 has separated still further from the hat profile 56.

At P5 some distance after P4 the crack in the adhesive 60 has grown further and the flat closer plate 58 has separated to a point where the stresses induced are above the failure stress in bending of the plate and a failure has occurred. This now forms a broken piece 58a of the closer plate which separates from the main structure and no longer participates in the crushing energy absorption.

FIG. 9 shows a graph of resistance force against distance obtained by the simulation as the crush progresses. Up to point P5 there is a substantially constant force as the closer plate 58 moves away from the top hat part 56. At point P5 when the part 58a breaks away there is a rapid reduction in resistance force to a lower stable value as the rest of the top hat part 56 continues to crush. This therefore closely matches the physical behaviour and leads to accurate predictive results.

By contrast in the prior art, e.g. CZone, a constant force would be returned in the circumstances illustrated—i.e. the graph in FIG. 9 would have been a flat line. This is clearly less reflective of the true physical situation and could, in some circumstances, lead to inaccurate results such as an inability to predict a catastrophic failure elsewhere in the structure or an overall resistance force which is lower than intended.

The invention claimed is:

1. A method of calculating an impact resistance of a structure undergoing an impact with an impact surface, the structure including a first part bonded or secured to a second part, at least the first part comprising a material having a crush failure mode, the method comprising:
   a) determining that a finite element representing a portion of the first part is experiencing conditions which dictate that it will undergo said crush failure mode;
   b) determining an ongoing resistance force representing said crush failure mode of said element;
   c) determining a further force acting on said first and second parts in a direction tending to separate them; and
   d) determining a behaviour of said structure using the determined ongoing resistance force and the determined further force.

2. A method as claimed in claim 1 wherein at least one of the ongoing resistance force representing the crush failure mode or the further force acting to separate the first and second parts is allocated a single empirically determined macroscopic value for a given set of macroscopic conditions.

3. A method as claimed in claim 1 wherein the further force is a function of a separation between the first and second parts.

4. A method as claimed in claim 3 wherein the further force is inversely dependent on the separation between the first and second parts.

5. A method as claimed in claim 3 wherein said further force is also a function of at least one further variable.

6. A method as claimed in claim 1 wherein the further force is applied as part of a cohesive element formulation which encapsulates cohesive strength modelling and said further force.

7. A method as claimed in claim 1 wherein the further force is calculated as part of calculations to determine behaviour of a bond between the first and second parts.

8. A method as claimed in claim 1 wherein the element is subjected to axial crush failure wherein a component of force applied to the element perpendicular to a shortest axis is great enough to initiate crush failure.

9. A method as claimed in claim 1 wherein the first and second parts are susceptible to crush.

10. A method as claimed in claim 1 comprising adjusting a relative velocity of the impact surface and the first and second parts during passage of the impact surface through a space allocated to the element.

11. A method as claimed in claim 10 comprising modifying the resistive force may be modified along a length of the element in accordance with a predetermined function of the relative velocity.

12. A method as claimed in claim 1 comprising adjusting a relative angle between the impact surface and the first and second parts during passage of the impact surface through a space allocated to the element.

13. A method as claimed in claim 12 comprising modifying the resistive force may be modified along a length of the element in accordance with a predetermined function of the relative angle.

14. A method as claimed in claim 1 comprising specifying a friction of the crush interface with the impact surface.

15. A method as claimed in claim 1 comprising specifying damping coefficients.

16. A method as claimed in claim 1 wherein the crushable material comprises a fibre-reinforced composite material.

17. A data processing apparatus programmed to:
calculate an impact resistance of a structure undergoing an impact with an impact surface, the structure including a first part bonded or secured to a second part, at least the first part comprising a material having a crush failure mode, by:
 a) determining that a finite element representing a portion of the first part is experiencing conditions which dictate that it will undergo said crush failure mode;
 b) determining an ongoing resistance force representing said crush failure mode of said element;
 c) determining a further force acting on said first and second parts in a direction tending to separate them; and
 d) determining a behaviour of said structure using the determined ongoing resistance force and the determined further force.

18. A non-transitory computer readable medium comprising instructions to:
calculate an impact resistance of a structure undergoing an impact with an impact surface, the structure including a first part bonded or secured to a second part, at least the first part comprising a material having a crush failure mode, by:
 a) determining that a finite element representing a portion of the first part is experiencing conditions which dictate that it will undergo said crush failure mode;
 b) determining an ongoing resistance force representing said crush failure mode of said element;
 c) determining a further force acting on said first and second parts in a direction tending to separate them; and
 d) determining a behaviour of said structure using the determined ongoing resistance force and the determined further force.

* * * * *